US012662734B2

(12) United States Patent
Mori et al.

(10) Patent No.: US 12,662,734 B2
(45) Date of Patent: Jun. 23, 2026

(54) SUBSTRATE PROCESSING METHOD AND SUBSTRATE PROCESSING APPARATUS

(71) Applicant: Tokyo Electron Limited, Tokyo (JP)

(72) Inventors: Kiyoshi Mori, Fuchu City (JP); Haruhiko Furuya, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 594 days.

(21) Appl. No.: 18/146,569

(22) Filed: Dec. 27, 2022

(65) Prior Publication Data

US 2023/0203651 A1 Jun. 29, 2023

(30) Foreign Application Priority Data

Dec. 27, 2021 (JP) ................................. 2021-211865

(51) Int. Cl.
| | |
|---|---|
| *C23C 16/44* | (2006.01) |
| *C23C 16/455* | (2006.01) |
| *C23C 16/458* | (2006.01) |
| *H01J 37/32* | (2006.01) |

(52) U.S. Cl.
CPC .... *C23C 16/4412* (2013.01); *C23C 16/45587* (2013.01); *C23C 16/4585* (2013.01); *H01J 37/32715* (2013.01); *H01J 37/32752* (2013.01); *H01J 37/32761* (2013.01)

(58) Field of Classification Search
CPC .......... C23C 16/4412; C23C 16/45587; C23C 16/4585; C23C 16/4584; C23C 16/52; C23C 16/54; H01L 21/6719; H01L 21/68771; H01J 37/32715; H01J 37/32752; H01J 37/32761; H10P 72/0462; H10P 72/7621
USPC ...................................... 204/298.27; 118/730
See application file for complete search history.

(56) References Cited

U.S. PATENT DOCUMENTS

| | | | | |
|---|---|---|---|---|
| 5,324,386 | A | * | 6/1994 | Murakami .............. C30B 25/14 117/93 |
| 2019/0360633 | A1 | * | 11/2019 | Schaller ............ H01L 21/68792 |
| 2020/0126771 | A1 | | 4/2020 | Roh et al. |

FOREIGN PATENT DOCUMENTS

| | | | |
|---|---|---|---|
| EP | 3905311 | A1 | 11/2021 |
| JP | 2018-070906 | A | 5/2018 |

* cited by examiner

*Primary Examiner* — Rodney G Mcdonald
(74) *Attorney, Agent, or Firm* — Armstrong Teasdale LLP

(57) ABSTRACT

A substrate processing method includes: exhausting a first space in a processing container by an exhaust mechanism, which is configured to exhaust the first space via a gap by exhausting a second space in the processing container, or configured to exhaust the first space in a state in which a seal gas is caused to flow from the second space to the first space via the gap; and executing the substrate processing on a substrate while causing, by a driving mechanism configured to move a stage, a position of the stage to be changed such that a width of the gap becomes uniform in a time average.

13 Claims, 14 Drawing Sheets

Figure 14:
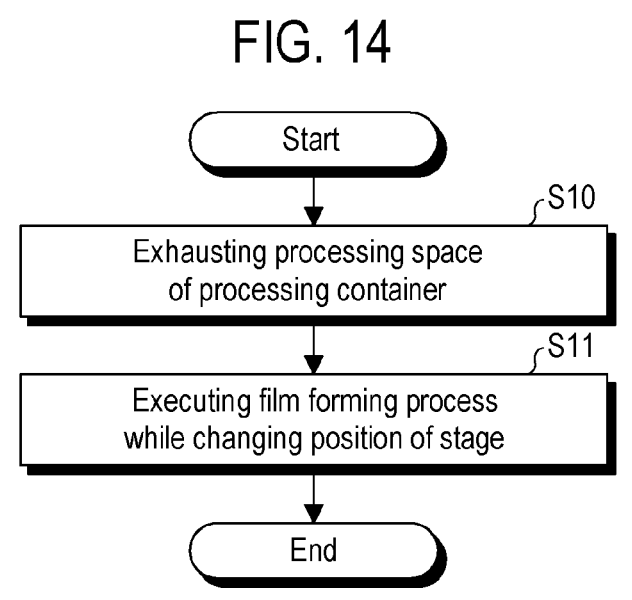

Start

S10

Exhausting processing space
of processing container

S11

Executing film forming process
while changing position of stage

End

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2021-211865, filed on Dec. 27, 2021, the entire contents of which are incorporated herein by reference.

TECHNICAL FIELD

The present disclosure relates to a substrate processing method and a substrate processing apparatus.

BACKGROUND

Patent Document 1 discloses a processing apparatus in which an interior of a processing container is partitioned, by a stage such as a mounting table on which a substrate is placed and a cover member, into an upper processing space configured to perform substrate processing and a lower bottom space.

PRIOR ART DOCUMENTS

Patent Documents

Patent Document 1: Japanese Laid-Open Patent Publication No. 2018-70906

SUMMARY

According to one embodiment of the present disclosure, there is provided a substrate processing method in a substrate processing apparatus. The substrate processing apparatus includes: a processing container; a stage disposed inside the processing container with a gap between an inner side wall of the processing container and a side surface of the stage or between a component constituting the processing container and the side surface of the stage, and configured to place a substrate on the stage, wherein the stage partitions an interior of the processing container into an upper first space, in which substrate processing is performed on the substrate, and a lower second space; an exhaust mechanism configured to exhaust the first space via the gap by exhausting the second space, or configured to exhaust the first space in a state in which a seal gas is caused to flow from the second space to the first space via the gap; and a driving mechanism configured to move the stage. The substrate processing method includes: exhausting the first space by the exhaust mechanism; and executing the substrate processing on the substrate while causing, by the driving mechanism, a position of the stage to be changed such that a width of the gap becomes uniform in a time average.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a view for explaining an example of a cause of non-uniform exhaust characteristics according to an embodiment.

FIG. 14 is a flowchart illustrating an example of a flow of a substrate processing method according to an embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate processing method and a substrate processing apparatus disclosed herein will be described in detail with reference to the drawings. The substrate processing method and the substrate processing apparatus disclosed herein are not limited by the following embodiments.

A substrate processing apparatus may have a structure in which an exhaust path is formed around a stage on which a substrate is placed. For example, the processing apparatus disclosed in Patent Document 1 has a structure in which exhaust ports are disposed with a gap around the stage, and a seal gas is caused to flow from the gap and exhausted from the exhaust ports around the stage. In addition, the exhaust path may have a structure in which, for example, a gap is provided around a stage and a gas is exhausted downward from the gap.

In the case where the exhaust path described above is provided, due to an influence of the gap around the stage, the exhaust characteristics become non-uniform in a circumferential direction of the stage, causing a deviation in a gas flow, which may make substrate processing results non-uniform in the circumferential direction of the stage. Therefore, a technique for suppressing non-uniformity in substrate processing results in the circumferential direction of the stage is expected.

Embodiment

[Configuration of Vacuum Processing System]

Figure 1:
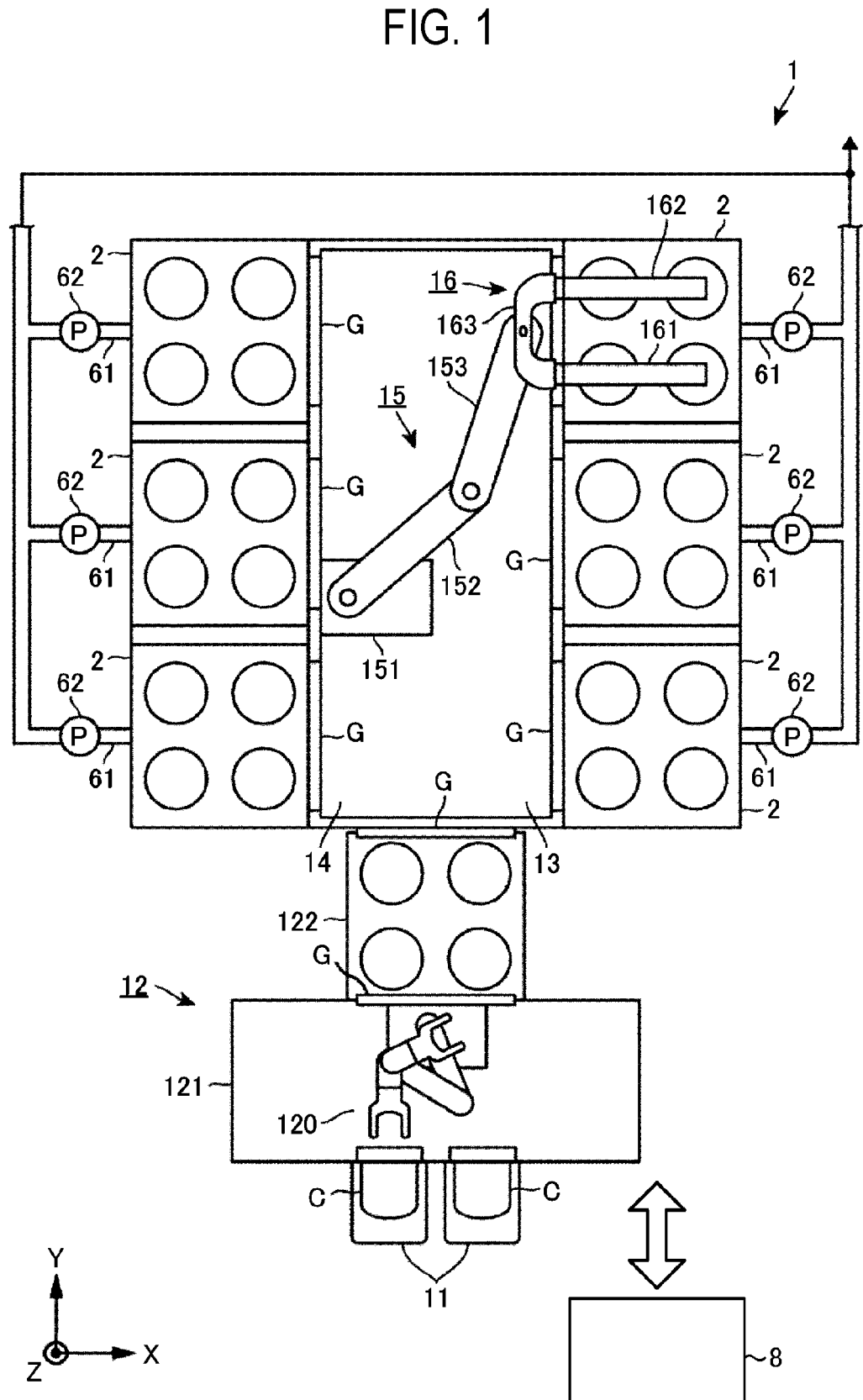
FIG. 1 is a schematic plan view illustrating an exemplary configuration of a vacuum processing system according to an embodiment.

An example of a substrate processing apparatus of the present disclosure will be described. In an embodiment described below, a case where the substrate processing apparatus of the present disclosure forms a system configuration of a vacuum processing system will be described as an example. FIG. 1 is a schematic plan view illustrating an example of a configuration of a vacuum processing system according to an embodiment. The vacuum processing system 1 includes load/unload ports 11, a load/unload module 12, a vacuum transfer module 13, and vacuum processing apparatuses 2. In FIG. 1, an X direction will be described as a left-right direction, a Y direction will be described as a front-rear direction, a Z direction will be referred to as an up-down direction (height direction), and the load/unload ports 11 will be described as being on a front side in the front-rear direction. The load/unload ports 11 are connected to a front side of the load/unload module 12, and the vacuum transfer module 13 is connected to a rear side of the load/unload module 12 in the front-rear direction.

A carrier C, which is a transfer container accommodating a substrate to be processed, is placed in each load/unload port 11. The substrate is a wafer W, which is a circular substrate having a diameter of, for example, 300 mm. The load/unload module 12 is a module configured to perform loading and unloading of the wafer W between the carrier C and the vacuum transfer module 13. The load/unload module 12 includes a normal-pressure transfer chamber 121 configured to transfer the wafer W to and from the carrier C in a normal-pressure atmosphere by a transfer mechanism 120, and a load-lock chamber 122 configured to switch an atmosphere under which the wafer W is placed between the normal-pressure atmosphere and a vacuum atmosphere.

The vacuum transfer module 13 includes a vacuum transfer chamber 14 configured to maintain an interior thereof to be a vacuum atmosphere. A substrate transfer mechanism 15 is disposed inside the vacuum transfer chamber 14. The vacuum transfer chamber 14 has, for example, a rectangular shape having long sides in a direction along the front-rear direction in a plan view. Among four side walls of the vacuum transfer chamber 14, a plurality of (for example, three) vacuum processing apparatuses 2 is connected to each of opposite long sides of the rectangle. In addition, among the four side walls of the vacuum transfer chamber 14, the load-lock chamber 122 installed in the load/unload module 12 is connected to the front short side. Gate valves G are disposed between the normal-pressure transfer chamber 121 and the load-lock chamber 122, between the load-lock chamber 122 and the vacuum transfer module 13, and between the vacuum transfer module 13 and each of the vacuum processing apparatuses 2, respectively. The gate valves G open and close load/unload ports for the wafer W, which are provided in mutually connected modules, respectively.

The substrate transfer mechanism 15 transfers the wafer W between the load/unload module 12 and each of the vacuum processing apparatuses 2 under the vacuum atmosphere. The substrate transfer mechanism 15 is configured by an articulated arm, and includes a substrate holder 16 configured to hold the wafer W. Each vacuum processing apparatus 2 collectively processes a plurality of (e.g., four) wafers W by using a processing gas under the vacuum atmosphere. Therefore, the substrate holder 16 of the substrate transfer mechanism 15 is configured to hold, for example, four wafers W so as to collectively deliver the four wafers W to each of the vacuum processing apparatuses 2.

Specifically, the substrate transfer mechanism 15 includes, for example, a base 151, a horizontally extending first arm 152, a horizontally extending second arm 153, and the substrate holder 16. The first arm 152 has a base portion provided on the base 151 and swivels around a vertical swivel axis on the base 151. The second arm 153 has a base portion provided on a tip end portion of the first arm 152 and swivels around a vertical swivel axis on the tip end portion of the first arm 152. The substrate holder 16 includes a first substrate holder 161, a second substrate holder 162, and a connector 163. The first substrate holder 161 and the second substrate holder 162 are configured in a shape of two elongated spatulas extending horizontally and parallel to each other. The connector 163 extends horizontally to be orthogonal to the extending direction of the first and second substrate holders 161 and 162, and connects base ends of the first and second substrate holders 161 and 162 to each other. A central portion of the connector 163 in a length direction is provided on a tip end portion of the second arm 153 and swivels around a vertical swivel axis on the tip end portion of the second arm 153. The first substrate holder 161 and the second substrate holder 162 will be described later.

The vacuum processing system 1 includes a controller 8. The controller 8 is, for example, a computer including a processor, a storage, an input device, a display device, and the like. The controller 8 controls respective components of the vacuum processing system 1. With the controller 8, an operator may perform a command input operation or the like by using the input device in order to manage the vacuum processing system 1. In addition, in the controller 8, an operating state of the vacuum processing system 1 may be visualized and displayed by the display device. In addition, the storage of the controller 8 stores a control program, recipe data, and the like to control various processes executed in the vacuum processing system 1 by the processor. The processor of the controller 8 executes the control program and controls respective components of the vacuum processing system 1 according to the recipe data, whereby desired substrate processing is executed in the vacuum processing system 1.

[Configuration of Vacuum Processing Apparatus 2]

Figure 2:
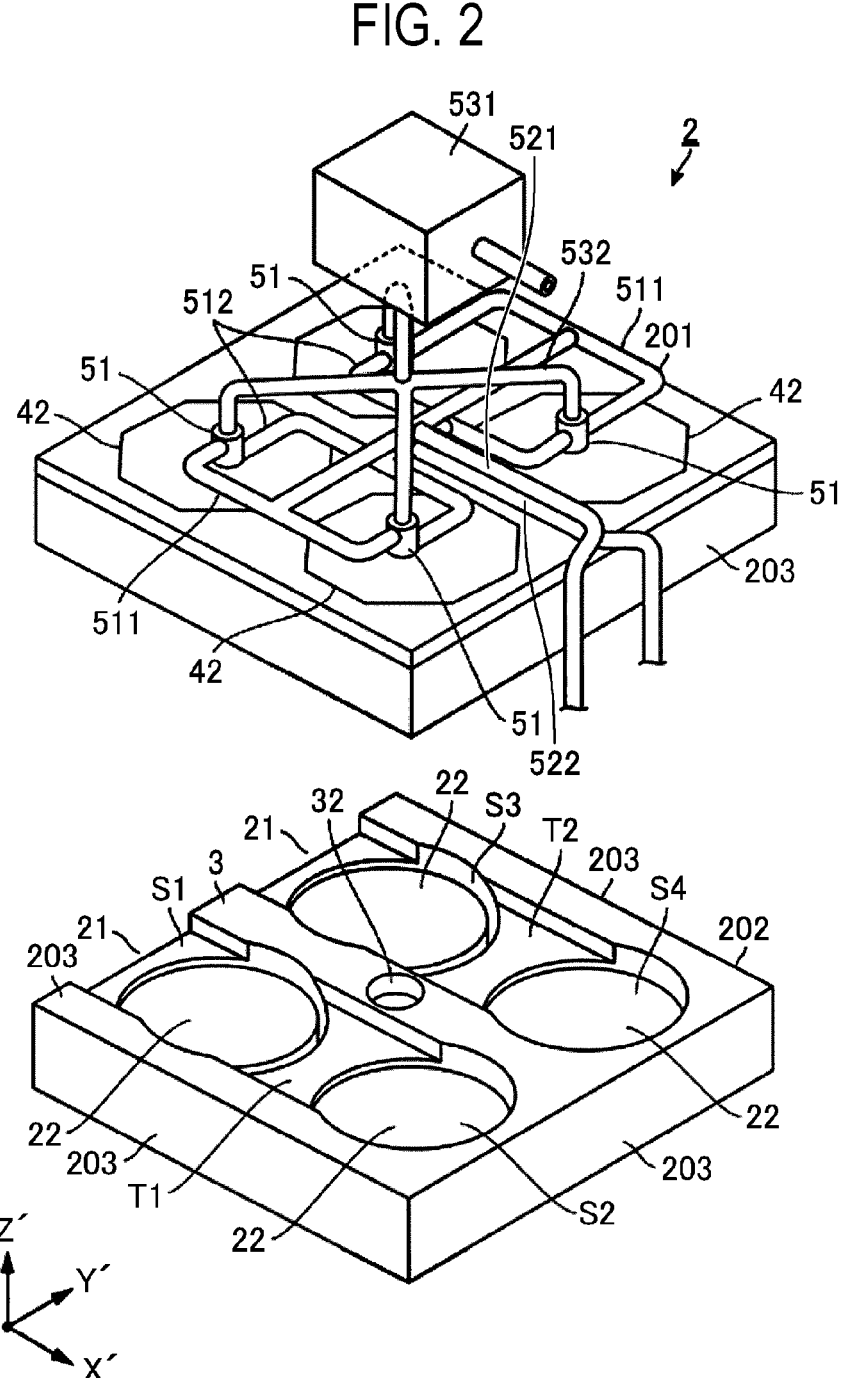
FIG. 2 is an exploded perspective view illustrating an exemplary configuration of a vacuum processing apparatus according to an embodiment.
Figure 3:
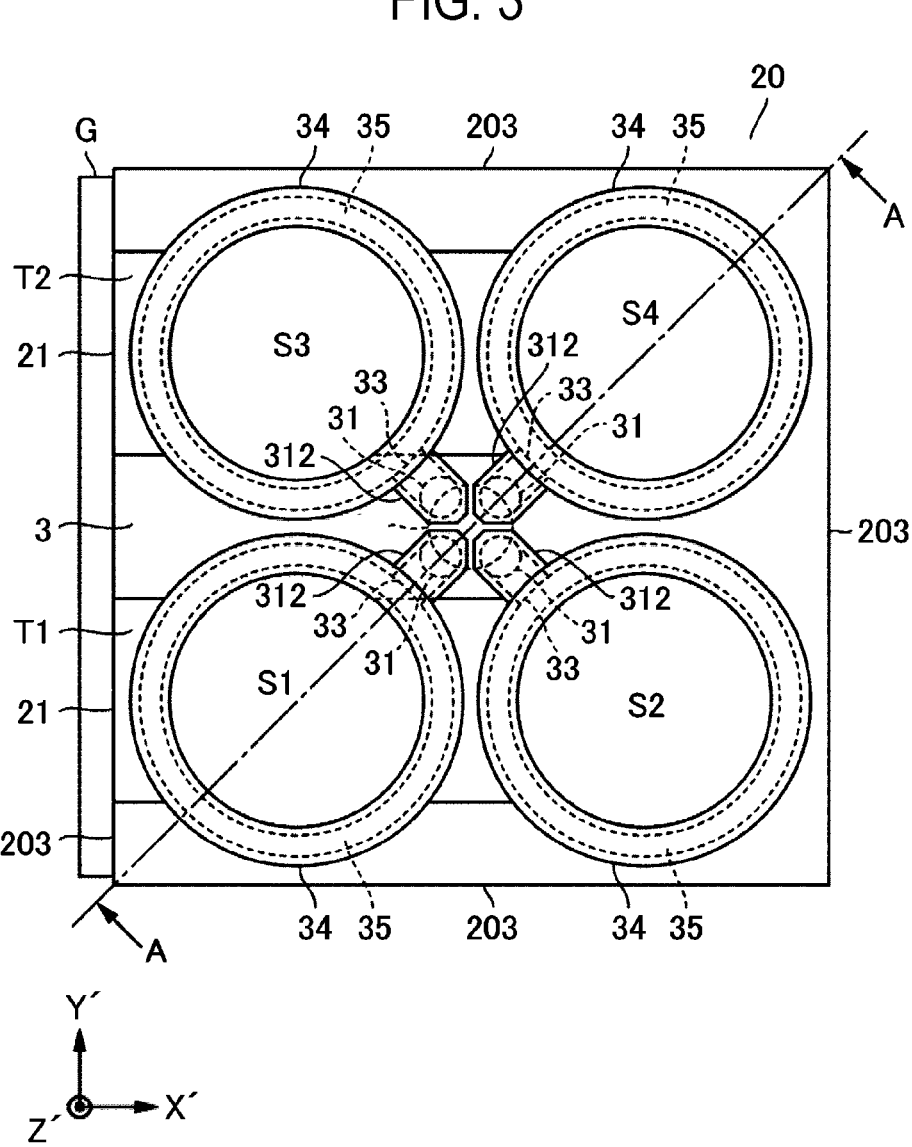
FIG. 3 is a plan view schematically illustrating an internal configuration of the vacuum processing apparatus according to an embodiment.

Next, the vacuum processing apparatus 2 will be described with reference to FIGS. 2 to 4. In the following description, assuming that the vacuum processing apparatus 2 is a film forming apparatus that performs a film forming process, a case where the vacuum processing apparatus 2 performs a film forming process such as a plasma chemical vapor deposition (CVD) process on the wafer W as substrate processing will be described as a main example. FIG. 2 is an exploded perspective view illustrating an example of a configuration of the vacuum processing apparatus 2 according to an embodiment. FIG. 3 is a plan view schematically illustrating an internal configuration of the vacuum processing apparatus 2 according to an embodiment.

Six vacuum processing apparatuses 2 are similarly configured. The six vacuum processing apparatuses 2 may process wafers W in parallel. Each vacuum processing apparatus 2 includes a processing container (a vacuum container) 20 having a rectangular shape in a plan view. The processing container 20 is configured to maintain an interior thereof to be a vacuum atmosphere. The processing container 20 is configured by closing concave open portions provided on a top surface of a container main body 202 with a ceiling 201. The processing container 20 has, for example, four side walls 203 surrounding a periphery thereof. Among the four side walls 203, a side wall 203 connected to the vacuum transfer chamber 14 includes two load/unload ports 21 disposed in the front-rear direction (the Y' direction in FIG. 2). The load/unload ports 21 are opened and closed by the gate valve G.

As illustrated in FIGS. 2 and 3, inside the processing container 20, a first transfer space T1 and a second transfer space T2, which extend in the horizontal direction from respective load/unload ports 21 to transfer wafers W therethrough, are provided at positions adjacent to each other. In addition, in the processing container 20, an intermediate wall 3 is provided between the first transfer space T1 and the second transfer space T2 along the extending direction of (the X' direction in FIG. 2). Two processing spaces S1 and S2 are disposed in the first transfer space T1 along the extending direction, and two processing spaces S3 and S4 are arranged in the second transfer space T2 along the extending direction. Therefore, in the processing container 20, a total of four processing spaces S1 to S4 are disposed in a 2×2 matrix when viewed from top. The horizontal direction referred to herein also includes a case in which due to influence of manufacturing tolerances, the wafers W are slightly inclined with respect to the extending direction within a range that causes no influence such as contact between devices during a load/unload operation of the wafers W.

Figure 4:
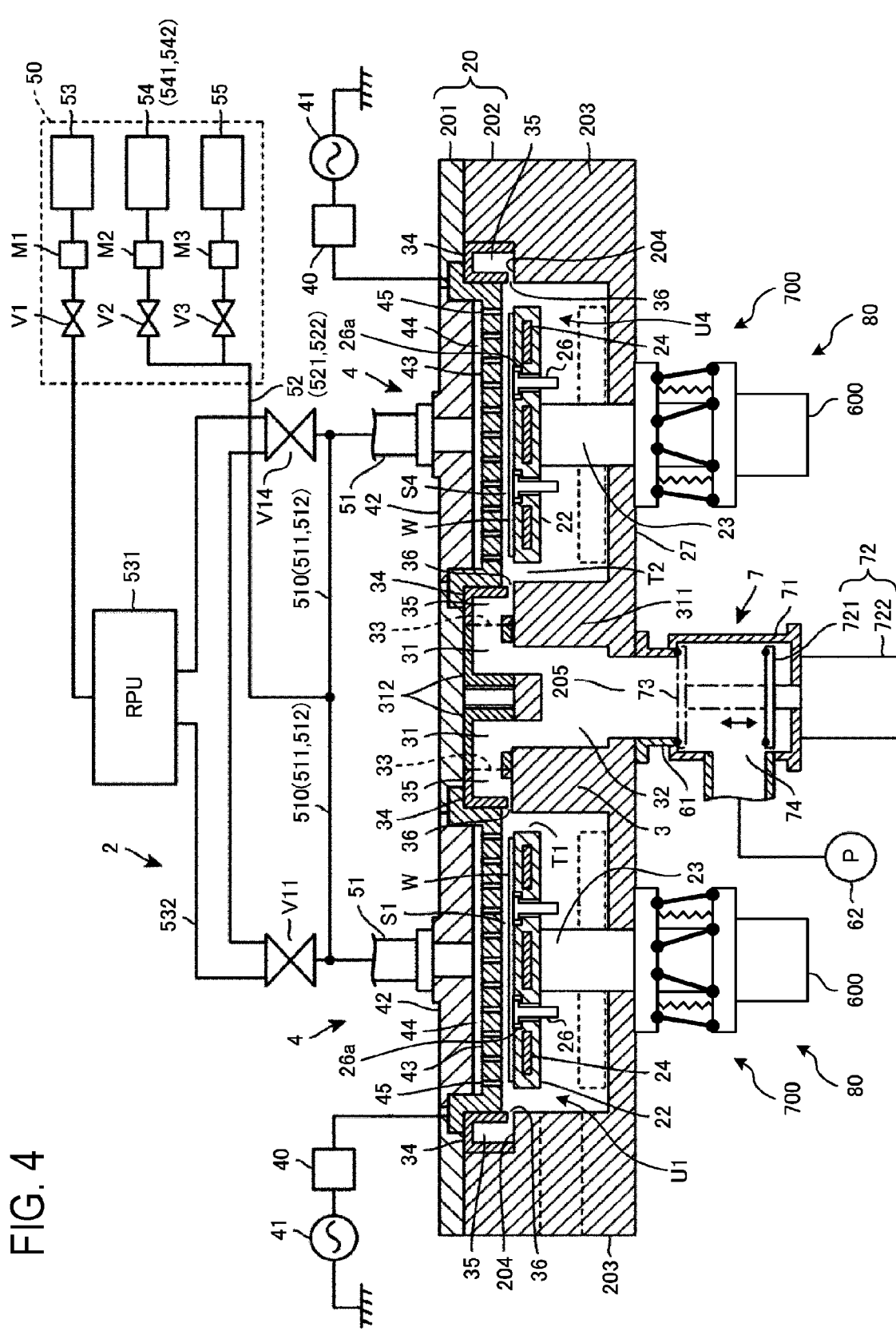
FIG. 4 is a schematic cross-sectional view illustrating an exemplary configuration of the vacuum processing apparatus according to an embodiment.

FIG. 4 is a schematic cross-sectional view illustrating an example of the configuration of the vacuum processing apparatus 2 according to an embodiment. The cross section of FIG. 4 corresponds to the cross section of the vacuum processing apparatus 2 taken along the line A-A in FIG. 3. The four processing spaces S1 to S4 are formed between stages 22, on each of which a wafer W is placed, and gas supplies 4 disposed to face the stages 22, respectively. The four processing spaces S1 to S4 are configured similarly to one another. In other words, in the processing container 20, for each of the four processing spaces S1 to S4, a stage 22 and a gas supply 4 are provided. FIG. 4 illustrates the processing space S1 of the first transfer space T1 and the processing space S4 of the second transfer space T2. Hereinafter, the processing space S1 will be described as an example.

The stage 22 also serves as a lower electrode. The stage 22 is made of, for example, a metal or aluminum nitride (AlN) in which a metallic mesh electrode is embedded, and has a flat columnar shape. The stage 22 is configured to be movable by a driving mechanism 80. The driving mechanism 80 includes a rotary driving mechanism 600 and an adjustment mechanism 700. The stage 22 is supported by a support 23 from below. The support 23 is formed in a cylindrical shape, extends vertically downwards, and penetrates a bottom 27 of the processing container 20. A lower end portion of the support 23 is located outside the processing container 20 and connected to the rotary driving mechanism 600. The support 23 is configured to be rotatable by the rotary driving mechanism 600 with the support 23 as a rotation axis. The stage 22 is configured to be rotatable according to a rotation of the support 23. The adjustment mechanism 700 configured to adjust a position and inclination of the stage 22 is provided at the lower end portion of the support 23. The stage 22 is configured to be raised and lowered between a processing position and a delivery position via the support 23 by the adjustment mechanism 700. In FIG. 4, the stage 22 located at the processing position is drawn with a solid line, and the stage 22 located at the delivery position is drawn with a broken line. The processing position is a position when substrate processing (e.g., a film forming process) is executed, and the delivery position is a position at which the wafer W is delivered to and from the substrate transfer mechanism 15. The rotary driving mechanism 600 and the adjustment mechanism 700 will be described later.

A heater 24 is embedded in the stage 22. The heater 24 heats each wafer W placed on the stage 22 to, for example, about 60 degrees C. to 600 degrees C. In addition, the stage 22 is connected to a ground potential.

In addition, the stage 22 is provided with a plurality of (e.g., three) pin through-holes 26a, and a lifter pin 26 is disposed inside each of the pin through-holes 26a. The pin through-holes 26a are provided to penetrate the stage 22 from a placement surface (top surface) of the stage 22 to a rear surface (bottom surface) opposite to the placement surface. Each lifter pin 26 is slidably inserted into the pin through-hole 26a. An upper end of the lifter pin 26 is suspended by the pin through-hole 26a at a side of the placement surface. That is, the upper end of the lifter pin 26 has a diameter larger than that of the pin through-hole 26a. At an upper end of the pin through-hole 26a, a recess having a diameter and thickness larger than those of the upper end of the lifter pin 26 and configured to accommodate the upper end of the lifter pin 26 is provided. Thus, the upper end of the lifter pin 26 is engaged with the stage 22 and suspended by the pin through-hole 26a at the side of the placement surface. In addition, a lower end of the lifter pin 26 protrudes from the rear surface of the stage 22 toward the bottom 27 of the processing container 20.

As illustrated in FIG. 4, in a state in which the stage 22 is raised to the processing position, the upper ends of the lifter pins 26 are received in the recesses in the pin through-holes 26a at the side of the placement surface, respectively. When the stage 22 is lowered to the delivery position from the state described above, the lower ends of the lifter pins 26 are brought into contact with the bottom 27 of the processing container 20 and the lifter pins 26 move in the pin through-holes 26a, so that the upper ends of the lifter pins 26 protrude from the placement surface of the stage 22. The processing container 20 may be provided with a lifter pin contact member on the side of the bottom and configured such that the lower ends of the lifter pins 26 are brought into contact with the lifter pin contact member, so that the lifter pins 26 are raised or lowered by a vertical movement of the pin contact member.

Here, the first and second substrate holders 161 and 162 will be described. The first substrate holder 161 is configured to hold wafers W at positions corresponding to arrangement positions of the processing spaces S1 and S2 in the first transfer space T1, respectively, when the first substrate holder 161 enters the first transfer space T1. The positions corresponding to the arrangement positions of the processing spaces S1 and S2 in the first transfer space T1 are positions set to deliver wafers W to the two stages 22 provided in the processing spaces S1 and S2 of the first transfer space T1. In addition, the second substrate holder 162 is configured to hold wafers W at positions corresponding to arrangement positions of the processing spaces S3 and S4 in the second transfer space T2, respectively, when the second substrate holder 161 enters the second transfer space T2. The positions corresponding to the arrangement positions of the processing spaces S3 and S4 in the second transfer space T2 are positions set to deliver wafers W to the two stages 22 provided in the processing spaces S3 and S4 of the second transfer space T2.

For example, a width of each of the first and second substrate holders 161 and 162 is smaller than the diameter of the wafers W. Each of the first and second substrate holders 161 and 162 support two wafers W on a side of a tip end and a side of a base end, respectively, with a gap therebetween. The wafers W supported on the sides of the tip ends of the first and second substrate holders 161 and 162 are supported, for example, such that center portions thereof are supported on the tip ends of the first and second substrate holders 161 and 162, respectively.

As described above, by the cooperative action of the substrate transfer mechanism 15, the lifter pins 26, and the stages 22, for example, four wafers W are collectively and concurrently delivered between the substrate transfer mechanism 15 and the respective stages 22.

The ceiling 201 of the processing container 20 is provided with gas supplies 4. The gas supplies 4 are provided above the stages 22 via guides 34 made of an insulator. Each gas supply 4 functions as an upper electrode. The gas supply 4 includes a lid 42, a shower plate 43 forming a facing surface provided to face the placement surface of the stage 22, and a gas flow chamber 44 formed between the lid 42 and the shower plate 43. A gas pipe 51 is connected to the lid 42. In the shower plate 43, gas ejection holes, which penetrate the shower plate 43 in a thickness direction, are arranged, for example, vertically and horizontally. The shower plate 43 ejects a gas from each gas ejection hole 45 toward the stage 22 in a shower form.

Each gas supply 4 is connected to a gas supply system 50 via the gas pipe 51. The gas supply system 50 includes, for example, sources of a reaction gas (a film forming gas), a purge gas, and a cleaning gas, which are a processing gas, pipes, valves V, flow rate controllers M, or the like.

A radio frequency power supply 41 is connected to the shower plate 43 via a matcher 40. The shower plate 43 functions as an upper electrode facing the stage 22. When the radio frequency power supply 41 applies radio frequency power between the shower plate 43 as the upper electrode and the stage 22 as the lower electrode, the gas supplied from the shower plate 43 to the processing space S1 (e.g., a reaction gas in this example) is plasmarized through capacitive coupling.

Next, an exhaust path and a confluent exhaust path formed in the intermediate wall 3 will be described. As illustrated in FIGS. 3 and 4, the intermediate wall 3 includes exhaust paths 31 provided for the four processing spaces S1 to S4, respectively, and a confluent exhaust path 32 at which the exhaust paths 31 merge. The confluent exhaust path 32 extends in the up-down direction in the intermediate wall 3. The intermediate wall 3 is configured by a wall main body 311 provided on a side of the container main body 202 and exhaust path forming members 312 provided on a side of the ceiling 201. The exhaust paths 31 are provided inside the exhaust path forming members 312, respectively.

In addition, on a wall surface of the intermediate wall 3 located outside each of the processing spaces S1 to S4, an exhaust port 33 is formed for each of the processing spaces S1 to S4. Each exhaust path 31 is formed in the intermediate wall 3 to connect the exhaust port 33 and the confluent exhaust path 32 to each other. Each exhaust path 31 extends, for example, in the horizontal direction in the intermediate wall 3, and is then bent downward and extends in the up-down direction to be connected to the confluent exhaust path 32. For example, the exhaust path 31 has a circular cross section (see FIG. 3), a downstream end of each exhaust path 31 is connected to an upstream end of the confluent exhaust path 32, and an upstream side of each exhaust path 31 is the exhaust port 33 that is open to the outside of each of the processing spaces S1 to S4.

Around each of the processing spaces S1 to S4, the guide 34 for exhaust is provided to surround each of the processing spaces S1 to S4. The guide 34 is, for example, an annular body, which is provided to surround a region around the stage 22 located at the processing position with a gap with respect to the stage 22. The guide 34 is configured to form therein an annular flow path 35 having, for example, a rectangular vertical cross section and an annular shape in a plan view. FIG. 3 schematically illustrates the processing spaces S1 to S4, the guides 34, the exhaust paths 31, and the confluent exhaust path 32.

As illustrated in FIG. 4, each guide 34 has, for example, a U shape in a vertical cross section, and is disposed such that an opening portion of the U shape faces downwards. The guides 34 are inserted into recesses 204 formed on a side of the intermediate wall 3 or on sides of the side walls 203 of the container main body 202. The guides 34 form the flow paths 35 with the members forming the intermediate wall 3 and the side walls 203.

The guides 34 inserted into the respective recesses 204 form slit-shaped slit exhaust ports 36 which are open toward the respective processing spaces S1 to S4. In this way, a slit exhaust port 36 is formed in a side peripheral portion of each of the processing spaces S1 to S4 along the circumferential direction. The exhaust ports 33 are connected to the flow paths 35, so that the processing gas exhausted from the slit exhaust ports 36 is caused to flow toward the exhaust ports 33.

Attention is focused on a set of the two processing spaces S1 and S2 disposed along the extending direction of the first transfer space T1 and a set of the two processing spaces S3 and S4 disposed along the extending direction of the second transfer space T2. As illustrated in FIG. 3, the set of the processing spaces S1 and S2 and the set of the processing spaces S3 and S4 are disposed rotationally symmetrically by 180 degrees around the confluent exhaust path 32 when viewed from top.

As a result, the processing gas flow paths, which extend from the respective processing spaces S1 to S4 to the confluent exhaust path 32 via the slit exhaust ports 36, the flow paths 35 of the guides 34, the exhaust ports 33, and the exhaust paths 31, surround the confluent exhaust path 32 with rotational symmetry by 180 degrees. In addition, focusing only on the processing gas flow paths while excluding positional relationships with the first and second transfer spaces T1 and T2 or the intermediate wall 3, it may be said that the flow paths surround the confluence exhaust path 32 with rotational symmetry by 90 degrees.

The confluent exhaust path 32 is connected to an exhaust pipe 61 via a confluent exhaust port 205 formed in the bottom 27 of the processing container 20. The exhaust pipe 61 is connected to a vacuum pump 62 forming a vacuum exhaust mechanism via a valve mechanism 7. For example, one vacuum pump 62 is provided to each processing container 20 (see FIG. 1), and the exhaust pipes 61 on a downstream sides of each vacuum pump 62 are merged and connected to, for example, a factory exhaust system.

The valve mechanism 7 opens and closes a processing gas flow path formed inside the exhaust pipe 61. The valve mechanism 7 includes, for example, a casing 71 and an opening/closing part 72. A first opening 73 connected to the exhaust pipe 61 on an upstream side is formed in a top surface of the casing 71. A second opening 74 connected to the exhaust pipe 61 on a downstream side is formed in a side surface of the casing 71.

The opening/closing part 72 includes, for example, an opening/closing valve 721 and a lifting mechanism 722. The opening/closing valve 721 has a size that can block the first opening 73. The lifting mechanism 722 is provided outside the casing 71 and raises and lowers the opening/closing valve 721 within the casing 71. The opening/closing valve 721 is configured to be raised and lowered between a closing position (indicated by the alternated long and short dash line in FIG. 4) for closing the first opening 73 and an opening position (indicated by the solid line in FIG. 4) retracted to below the first and second openings 73 and 74. When the opening/closing valve 721 is located at the closing position, a downstream end of the confluent exhaust port 205 is closed, and exhaust of the interior of the processing container 20 is stopped. In addition, when the opening/closing valve 721 is located at the opening position, the downstream end of the confluent exhaust port 205 is opened and the interior of the processing container 20 is exhausted.

Next, a processing gas supply system will be described with reference to FIG. 2. In the following, a case of using two types of reaction gases will be described as an example. The gas pipe 51 is connected to substantially a center of a top surface of each gas supply 4. The gas pipe 51 is connected to a first reaction gas source 541 and a purge gas source 55 by a first gas pipe 511 via a first common gas path 521. In addition, the gas pipe 51 is connected to a second reaction gas source 542 and the purge gas source 55 by a second gas pipe 512 via a second common gas path 522. In FIG. 4, for convenience, the first common gas path 521 and the second common gas path 522 are collectively illustrated as a gas path 52. In addition, the first reaction gas source 541 and the second reaction gas source 542 are collectively illustrated as a reaction gas source 54. In addition, the first gas pipe 511 and the second gas pipe 512 are collectively illustrated as a gas pipe 510. A valve V2 and a flow rate controller M2 are used for supplying a reaction gas, and a valve V3 and a flow rate controller M3 are used for supplying a purge gas.

In addition, the gas pipe 51 is connected to a cleaning gas source 53 by a cleaning gas path 532 via a remote plasma unit (RPU) 531. The cleaning gas path 532 branches into four systems at a downstream side of the RPU 531, and each branched path is connected to the gas pipe 51. A valve V1 and a flow rate controller M1 are provided on an upstream side of the RPU 531 in the cleaning gas path 532. On the downstream side of the RPU 531, valves V11 to V14 are provided for the branched pipes, respectively. During a cleaning time, corresponding ones of the valves V11 to V14 are opened. For convenience, only the valves V11 and V14 are illustrated in FIG. 4. The gas supply system 50 supplies various gases used for film formation. Taking a case where an insulating oxide film (SiO$_2$) is formed through CVD as an example, for example, tetraethoxysilane (TEOS) and oxygen (O$_2$) gas is used as the reaction gases, and an inert gas such as nitrogen (N$_2$) gas is used as the purge gas. When the TEOS and O$_2$ gas are used as the reaction gases, the TEOS is supplied from, for example, the first reaction gas source

541, and the O$_2$ gas is supplied from the second reaction gas source 542. As a cleaning gas, for example, nitrogen trifluoride (NF$_3$) gas is used.

When viewed from the processing gas distributed from the common gas path 52, the respective processing gas paths from the respective gas pipes 51 to the gas supply 4 are formed to have a mutually uniform conductance. For example, as illustrated in FIG. 2, a downstream side of the first common gas path 521 branches into two systems, and each branched gas path further branches into two systems such that first gas pipes 511 are formed in a tournament shape. The first gas pipes 511 are connected to the gas pipes 51, respectively, on a downstream side of the valves V11 to V14 for the cleaning gas. In addition, a downstream side of the second common gas path 522 branches into two systems, and each branched gas path further branches into two systems such that second gas pipes 512 are formed in a tournament shape. The second gas pipes 512 are connected to the gas pipes 51, respectively, on the downstream side of the valves V11 to V14 for the cleaning gas.

The first gas pipes 511 are formed such that each of the first gas pipes 511 has a uniform length and inner diameter from an upstream end (an end connected to the first common gas path 521) to a downstream end (an end connected to the gas supply 4 or the gas pipes 51). In addition, the second gas pipes 512 are formed such that each of the second gas pipes 512 has a uniform length and inner diameter from an upstream end (an end connected to the second common gas paths 522) to a downstream end. In this way, when viewed from the processing gas distributed from the first common gas path 521, the respective gas processing paths leading to the confluent exhaust path 32 via the first gas pipes 511, the gas supply 4, the processing spaces S1 to S4, and the exhaust paths 31 are formed to have a mutually uniform conductance. In addition, when viewed from the processing gas distributed from the second common gas path 522, the respective gas processing paths leading to the confluent exhaust path 32 via the second gas pipes 512, the gas supply 4, the processing spaces S1 to S4, and the exhaust paths 31 are formed to have a mutually uniform conductance.

The vacuum processing apparatus 2 is connected to the controller 8 of the vacuum processing system 1. The controller 8 is, for example, a computer including a processor, a memory, a storage, or the like. The controller 8 controls respective components of the vacuum processing apparatus 2. With the controller 8, an operator may perform a command input operation or the like by using an input device in order to manage the vacuum processing apparatus 2. In addition, the controller 8 may visualize and display an operating state of the vacuum processing apparatus 2 by a display device. The storage of the controller 8 stores a control program and recipe data for controlling various processes, which are executed in the vacuum processing apparatus 2 by the processor. The processor of the controller 8 executes the control program and controls the respective components of the vacuum processing apparatus 2 according to the recipe data, whereby desired processes are executed in the vacuum processing apparatus 2. For example, the controller 8 controls the respective components of the vacuum processing apparatus 2 to execute substrate processing such as an etching process or a film forming process on substrates loaded into the vacuum processing apparatus 2.

[Configuration of Rotary Driving Mechanism and Adjustment Mechanism]

Figure 5:
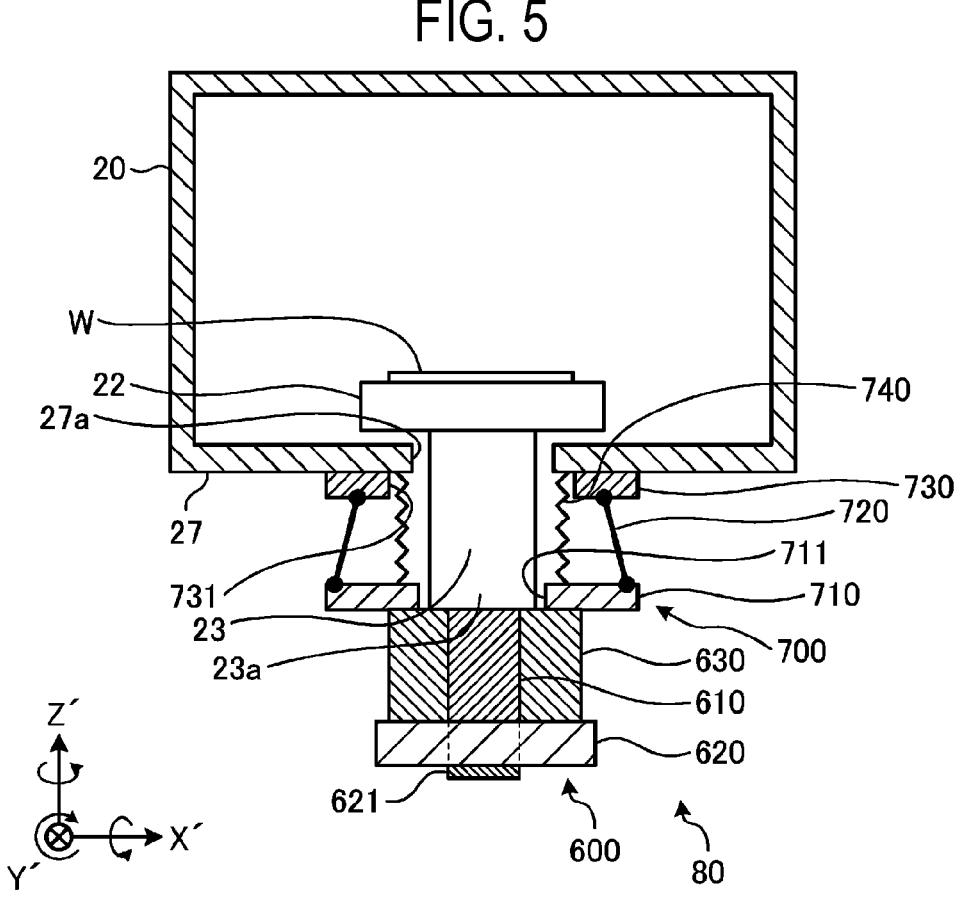
FIG. 5 is a view illustrating an exemplary configuration of a rotary driving mechanism and an adjustment mechanism according to an embodiment.

FIG. 5 is a view illustrating an example of a configuration of the rotary driving mechanism 600 and the adjustment mechanism 700 according to an embodiment. A hole 27a is formed in the bottom 27 of the processing container 20 at a position corresponding to a position where the stage 22 is supported. The support 23 is inserted into the hole 27a to support the stage 22 from below. The rotary driving mechanism 600 is connected to a lower end portion 23a of the support 23 located outside the processing container 20.

The rotary driving mechanism 600 includes a rotary shaft 610, a motor 620, and a vacuum seal 630.

The rotary shaft 610 is connected to the lower end portion 23a of the support 23, and is configured to be integrally rotatable with the support 23. A slip ring 621 is provided at a lower end portion of the rotary shaft 610. The slip ring 621 includes an electrode, and is electrically connected to various wirings for supplying power to components around the stage 22. For example, the slip ring 621 is electrically connected to a wiring for supplying power to the heater 24 embedded in the stage 22. For example, when an electrostatic chuck configured to electrostatically attract the wafer W is provided on the stage 22, the slip ring 621 is electrically connected to a wiring of a DC voltage applied to the electrostatic chuck.

The motor 620 is connected to the rotary shaft 610, and rotates the rotary shaft 610. When the rotary shaft 610 rotates, the stage 22 rotates via the support 23. When the rotary shaft 610 rotates, the slip ring 621 also rotates together with the rotary shaft 610, while the electrical connection between the slip ring 621 and various wirings for supplying power to the components around the stage 22 is maintained.

The vacuum seal 630 is, for example, a magnetic fluid seal. The vacuum seal 630 is provided around the rotary shaft 610 to allow the rotation of the rotary shaft 610 to be maintained while airtightly sealing the rotary shaft 610.

In addition, the adjustment mechanism 700 is engaged with the lower end portion 23a of the support 23 via the vacuum seal 630.

The adjustment mechanism 700 includes a base 710, a plurality of (e.g., six) actuators 720, an absorber 730, and a bellows 740.

The base 710 is engaged with the lower end portion 23a of the support 23 located outside the processing container 20 via the vacuum seal 630, and is configured to be integrally movable with the stage 22. For example, the base 710 has therein a hole 711 having a diameter larger than that of the lower end portion 23a of the support 23. The support 23 passes through the hole 711, and the lower end portion 23a is connected to the rotary shaft 610. The vacuum seal 630 is provided around the rotary shaft 610 connected to the lower end portion 23a of the support 23, and the base 710 is fixed to a top surface of the vacuum seal 630. Thus, the base 710 is connected to the stage 22 via the vacuum seal 630, the rotary shaft 610, the support 23, and the like, and can move integrally with the stage 22.

The actuators 720 are provided in parallel with one another between the bottom 27 of the processing container 20 and the base 710. The actuators 720 move the base 710 relative to the bottom 27 of the processing container 20 to adjust the position and inclination of the stage 22. The actuators 720 are individually expandable and contractible, and are rotatably and slidably connected to the base 710 via universal joints and rotatably and slidably connected to the bottom 27 of the processing container 20 via universal joints. The actuators 720 and the base 710 form a parallel link mechanism, which can move the base 710 in the X'-axis, Y'-axis, and Z'-axis directions illustrated in FIG. 5 and in rotation directions around the X'-axis, the Y'-axis, and the Z'-axis. A moving coordinate system of the parallel link mechanism formed by the actuators 720 and the base 710 is adjusted in advance so as to match a coordinate system of the processing container 20. By connecting the bottom 27 of the processing container 20 and the base 710 to each other via the parallel link mechanism, the actuators 720 are capable of relatively moving the base 710 with respect to the bottom 27 of the processing container 20. Thus, it is possible to adjust the position and inclination of the stage 22. For example, the actuators 720 adjust the position of the stage 22 by moving the base 710 in a direction orthogonal to an outer wall surface of the bottom 27 of the processing container 20 (e.g., in the Z'-axis direction in FIG. 5). In addition, for example, the actuators 720 adjust the position of the stage 22 by moving the base 710 in a direction following the outer wall surface of the bottom 27 of the processing container 20 (e.g., in the X'-axis direction and the-Y' axis direction in FIG. 5). Furthermore, for example, the actuators 720 adjust the inclination of the stage 22 by tilling the base 710 in a predetermined direction (e.g., in the rotation direction around the X'-axis and the rotation direction around the Y'-axis in FIG. 5) with respect to the outer wall surface of the bottom 27 of the processing container 20.

The position and inclination of the stage 22 adjusted by the actuators 720 may be specified by detecting the position and inclination of the base 710 by using various detectors. The detectors may include, for example, a linear encoder, a gyro sensor, a 3-axis acceleration sensor, a laser tracker, and the like.

In the vacuum processing apparatus 2, when a pressure inside the processing container 20 is switched from an atmospheric state to a vacuum state, the processing container 20 is deformed due to a pressure difference. In addition, a temperature of the processing container 20 is changed due to heat transferred thereto during substrate processing performed in the processing container 20, and the processing container 20 is also deformed by the temperature change. When the processing container 20 is deformed, stress due to the deformation of the processing container 20 is transferred to the stage 22, and the position or inclination of the stage 22 may be changed.

Therefore, in the vacuum processing apparatus 2 according to the present embodiment, the actuators 720 are provided between the bottom 27 of the processing container 20 and the base 710, which is movable integrally with the stage 22. The actuators 720 adjust the position or inclination of the stage 22 by relatively moving the base 710 with respect to the bottom 27. Thus, even when the position or inclination of the stage 22 changes due to the deformation of the processing container 20, it is possible to adjust the position and inclination of the stage 22 to an initial position and inclination. As a result, the vacuum processing apparatus 2 according to the present embodiment is capable of reducing or eliminating a deviation in the position and inclination of the stage 22 due to the deformation of the processing container 20. Therefore, it is possible to improve in-plane uniformity in substrate processing such as a film forming process.

The absorber 730 is provided on the bottom 27 of the processing container 20, and absorbs deformation of the bottom 27 of the processing container 20. A hole 731 is formed in the absorber 730 to communicate with the interior of the processing container 20 via the hole 27a in the bottom 27 of the processing container 20. The actuators 720 are connected to the absorber 730, rather than being directly connected to the bottom 27 of the processing container 20. As a result, even when the bottom 27 of the processing container 20 is deformed, stress due to the deformation of the bottom 27 of the processing container 20 is absorbed by the absorber 730 and is not transferred to the actuators 720. Thus, it is possible to suppress degradation in accuracy of adjusting the position or inclination of the stage 22. Details of the absorber 730 will be described later.

The bellows 740 is provided to surround the support 23. An upper end of the bellows 740 is connected to the bottom 27 of the processing container 20 via the hole 731 formed in the absorber 730, and a lower end of the bellows 740 is connected to the base 710. As a result, the bellows 740 airtightly seals a space between the bottom 27 of the processing container 20 and the base 710. The bellows 740 is configured to be expandable and contractible according to a movement of the base 710. For example, when the base 710 moves in the direction orthogonal to the outer wall surface of the bottom 27 of the processing container 20 (e.g., in the Z'-axis direction in FIG. 5), the bellows 740 expands and contracts in the Z'-axis direction. For example, when the base 710 moves in the direction following the outer wall surface of the bottom 27 of the processing container 20 (e.g., in the X'-axis direction and the Y'-axis direction in FIG. 5), the bellows 740 expands and contracts in the X'-axis direction and the Y'-axis direction. In addition, for example, when the base 710 moves in a predetermined direction with respect to the outer wall surface of the bottom 27 of the processing container 20 (e.g., in the rotation direction around the X'-axis and the rotation direction around the Y'-axis in FIG. 5), the bellows 740 expands and contracts in the rotation direction around the X'-axis and the rotation direction around the Y'-axis. In the vacuum processing apparatus 2, since the bellows 740 expands and contracts even when the base 710 moves, the air is not introduced into the processing container 20 via the space between the bottom 27 of the processing container 20 and the base 710, the hole 731, and the hole 27a.

Figure 6:
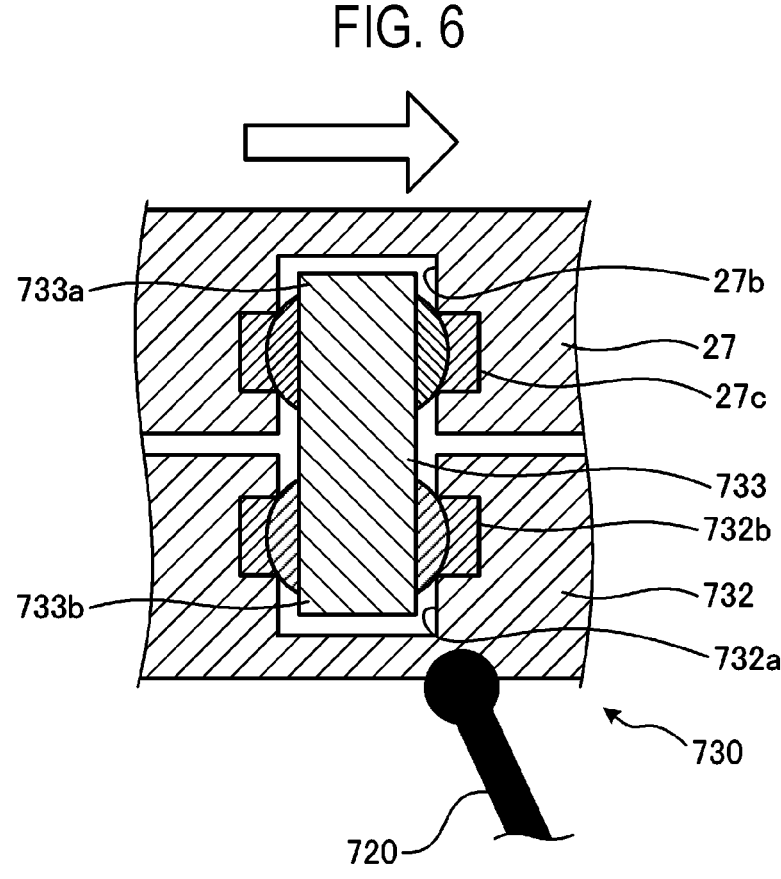
FIG. 6 is a view illustrating an exemplary configuration of an absorber illustrated in FIG. 5.

Here, an example of a configuration of the absorber 730 will be described with reference to FIG. 6. FIG. 6 is a view illustrating an exemplary configuration of the absorber 730 illustrated in FIG. 5. The absorber 730 includes a plate 732 and a rod 733.

The plate 732 is formed in a disk shape and disposed below the bottom 27 of the processing container 20. The plate 732 is distanced from the outer wall surface of the bottom 27 of the processing container 20 from the viewpoint of blocking transfer of heat and vibrations from the processing container 20.

One end of the rod 733 is rotatably and slidably connected to the bottom 27 of the processing container 20, and the other end of the rod 733 is rotatably and slidably connected to the plate 732. That is, a recess 27b is formed in the outer wall surface of the bottom 27 of the processing container 20, and a spherical bearing 27c, which is freely rotatable and slidable, is installed in the recess 27b. One end 733a of the rod 733 is rotatably and slidably connected to the bottom 27 of the processing container 20 by being connected to the spherical bearing 27c. On the other hand, a recess 732a is formed in a top surface of the plate 732 at a position corresponding to the recess 27b, and a spherical bearing 732b, which is freely rotatable and slidable, is installed in the recess 732a. The other end 733b of the rod 733 is rotatably and slidably connected to the plate 732 by being connected to the spherical bearing 732b. The rod 733 rotates in a direction corresponding to the deformation of the bottom 27 of the processing container 20, thereby suppressing transfer of the deformation to the plate 732. For example, when the bottom 27 of the processing container 20 is deformed in the direction indicated by the arrow in FIG. 6, the rod 733 receives stress by the deformation of the bottom 27, but is rotated together with the bottom 27 in the direction indicated by the arrow in FIG. 6, thereby suppressing transfer of the deformation to the plate 732. The actuators 720 are connected to the plate 732. Thus, the stress applied due to the deformation of the bottom 27 of the processing container 20 is not transferred to the actuators 720 via the plate 732, and it is possible to suppress degradation in accuracy of adjusting the position or inclination of the stage 22.

In addition, a plurality of rods 733 is disposed at a plurality of positions in a circumferential direction of the plate 732. For example, three rods 733 are provided at a plurality of positions inside an edge along the circumferential direction of the plate 732 at equal intervals. Four or more rods 733 may be provided at equal intervals along the circumferential direction of the plate 732.

Next, a flow of a film forming process performed on a wafer W by the vacuum processing system 1 according to the embodiment will be briefly described.

The controller 8 controls the substrate transfer mechanism 15 to transfer the wafer W toward the vacuum processing apparatus 2. The controller 8 calculates a deviation amount when the wafer W is transferred by the substrate transfer mechanism 15 as a correction amount of a position of the wafer W. The correction amount of the position of the wafer W is calculated by detecting, for example, the deviation amount between the wafer W and a target position of the transfer by the substrate transfer mechanism 15, by using a position detection sensor provided at an arbitrary position on a transfer path of the wafer W. The position detection sensor is provided, for example, in the vacuum transfer chamber 14 in which the substrate transfer mechanism 15 is disposed. In addition, the position detection sensor may be provided in the load/unload port 21 of the vacuum processing apparatus 2. The target position is a placement position of the wafer W on the stage 22, for example, a position at which a center of the stage 22 and a center of the wafer W coincide with each other.

The controller 8 controls the actuators 720 such that the base 710 moves from a predetermined reference position by the calculated correction amount. The reference position is a position at which the center of the stage 22 raised to the processing position should be located. For example, the reference position is a position at which the center of the stage 22 and a center of the shower plate 43 (e.g., a center of a region in which the gas ejection holes 45 are formed) coincide with each other. The reference position is determined, for example, when the vacuum processing apparatus 2 is designed or when the vacuum processing apparatus 2 is adjusted.

As the base 710 moves, the stage 22 also moves from the reference position by the correction amount. The controller 8 controls the actuators 720 such that the base 710 moves downward together with the stage 22 (that is, in a negative direction of the Z'-axis in FIG. 5). As a result, the stage 22 starts to be lowered. As the stage 22 moves downward, the lower ends of the lifter pins 26 are brought into contact with the bottom 27 of the processing container 20, and the upper ends of the lifter pins 26 protrude from the placement surface of the stage 22. In this step, the stage 22 is in a state of being lowered from the processing position to the delivery position.

When the substrate transfer mechanism 15 reaches the vacuum processing apparatus 2, the controller 8 controls the substrate transfer mechanism 15 to transfer the wafer W to a position above the target position in the processing container 20. In this step, the center of the stage 22 and the center of the wafer W coincide with each other.

Then, the controller 8 causes the wafer W to be delivered between the stage 22 and the substrate transfer mechanism 15. The controller 8 controls the actuators 720 such that the base 710 moves to the reference position. For example, the controller 8 controls the actuators 720 such that the base 710 moves upward together with the stage 22 (that is, in a positive direction of the Z'-axis in FIG. 5). As a result, the stage 22 starts to be raised. As the stage 22 moves upward, the lower ends of the lifter pins 26 separate from the bottom 27 of the processing container 20, and the upper ends of the lifter pins 26 are accommodated in the pin through-holes 26*a* on the side of the placement surface. As the base 710 moves, the stage 22 also moves to the reference position. In this step, the center of the stage 22, the center of the wafer W, and the reference position are aligned on a plane.

As described above, in the vacuum processing apparatus 2, instead of moving the substrate transfer mechanism 15 by the correction amount, the base 710 and the stage 22 are integrally moved by the correction amount to deliver the wafer W. Therefore, it is possible to reduce a transfer load of the substrate transfer mechanism 15. As a result, it is possible to improve throughput of the entire vacuum processing system 1.

For each vacuum processing apparatus 2, the controller 8 executes transfer of the wafers W in parallel to the four processing spaces S1 to S4 in the processing container 20 of the vacuum processing apparatus 2. Thus, when the substrate transfer mechanism 15 collectively transfers four wafers W to the four processing spaces S1 to S4 in the processing container 20, it is possible to collectively deliver the wafers W between the stage 22 and the substrate transfer mechanism 15. As a result, it is possible to further improve throughput of the entire vacuum processing system 1.

For each vacuum processing apparatus 2, the controller 8 executes a film forming process on the wafers W in the four processing spaces S1 to S4. For example, the controller 8 controls the lifting mechanism 722 and the vacuum pump 62 to locate the opening/closing valve 721 at the opening position so as to depressurize the pressure inside the processing container 20 by the vacuum pump 62. The controller 8 controls the gas supply system 50 to supply various gases used for film formation from the gas supply system 50, and to introduce the various gases from the respective gas supplies 4 into the processing spaces S1 to S4. The controller 8 causes the driving mechanism 80 to rotate the stages 22. For example, the controller 8 controls the rotary driving mechanisms 600 to rotate the stages 22 around the supports 23 supporting the stages 22 as rotation axes, respectively, by rotating the supports 23 by the rotary driving mechanisms 600. In addition, the controller 8 controls the respective radio frequency power supplies 41 to supply radio frequency power from the radio frequency power supplies 41, so that plasma is generated in the processing spaces S1 to S4 and the film forming process is executed on the wafers W. The controller 8 may rotate the stages 22 as necessary. In addition, the controller 8 may execute the film forming process on the wafers W in a state in which the stages 22 are stopped without being rotated.

Figure 7:
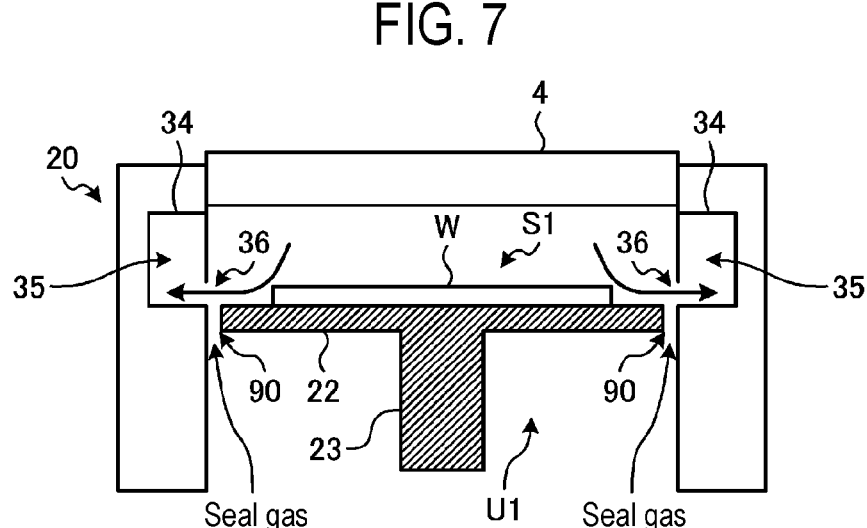
FIG. 7 is a view illustrating an example of a gas flow during substrate processing according to an embodiment.

FIG. 7 is a view illustrating an example of a gas flow during substrate processing according to an embodiment. FIG. 7 illustrates an example of a gas flow in the four processing spaces S1 to S4 in the processing container 20 when the film forming process is executed as substrate processing. Hereinbelow, the processing space S1 will be described as an example.

Inside the processing container 20, the stage 22 on which the wafer W is placed is disposed, and the gas supply 4 is disposed to face the stage 22. The processing space S1 is formed between the stage 22 and the gas supply 4. By placing the stages 22 to the processing positions by the driving mechanisms 80, the interior of the processing container 20 is partitioned, by the stages 22, into the upper processing spaces S1 to S4, in which the film forming process is executed on the wafers W, and the lower spaces U1 to U4. In FIG. 7, the interior of the processing container 20 is partitioned into the upper processing space S1 and the lower space U1 by the stage 22.

The processing container 20 is provided with the guide 34 for exhaust around the stage 22. The guide 34 is provided, for example, to surround a region around the stage 22, which is located at the processing position, with a gap 90 with respect to the stage 22. The guide 34 include the slit exhaust port 36 formed in the side surface thereof on the side of the processing space S1. The guide 34 includes therein the flow path 35 that communicates with the exhaust port 33. The exhaust port 33 communicates with the vacuum pump 62. Since exhaust is performed by the vacuum pump 62, the gas supplied to the processing space S1 flows from the slit exhaust port 36 of the guide 34 to the flow path 35 and is exhausted from the exhaust port 33 to the vacuum pump 62. The vacuum processing apparatus 2 according to an embodiment is configured such that a seal gas is capable of being supplied to the lower space U1 via a gas pipe (not illustrated). The seal gas may be the same as or different from the purge gas. As the seal gas, an inert gas such as nitrogen ($N_2$) gas is used. A source that supplies the seal gas to the lower space U1 may be the gas supply system 50 or another gas supply system.

When executing the film forming process, the vacuum processing apparatus 2 according to the embodiment supplies the seal gas to the lower space U1 to cause the seal gas to flow from the lower space U1 to the processing space S1 via the gap 90. The vacuum processing apparatus 2 performs exhaust by the vacuum pump 62, so that the processing space S1 is exhausted from the periphery of the stage 22 by means of the guide 34. In addition, the vacuum processing apparatus 2 supplies various gases used for the film formation from the gas supply 4 to the processing space S1. By exhausting the processing space S1 via the guide 34 in the state in which the seal gas is caused to flow from the lower space U1 to the processing space S1 via the gap 90, it is possible to suppress the gas supplied from the gas supply 4 to the processing space S1 from flowing into the lower space U1 via the gap 90.

In the present embodiment, description has been made on the case where the vacuum processing apparatus 2 is configured such that the processing space S1 is exhausted from the periphery of the stage 22 by means of the guide 34 in the state in which the seal gas is caused to flow from the lower space U1 to the processing space S1 via the gap 90. However, the present disclosure is not limited thereto. The vacuum processing apparatus 2 may be configured such that the processing space S1 is exhausted via the gap 90 by exhausting the lower space U1 of the processing container 20.

Figure 8:
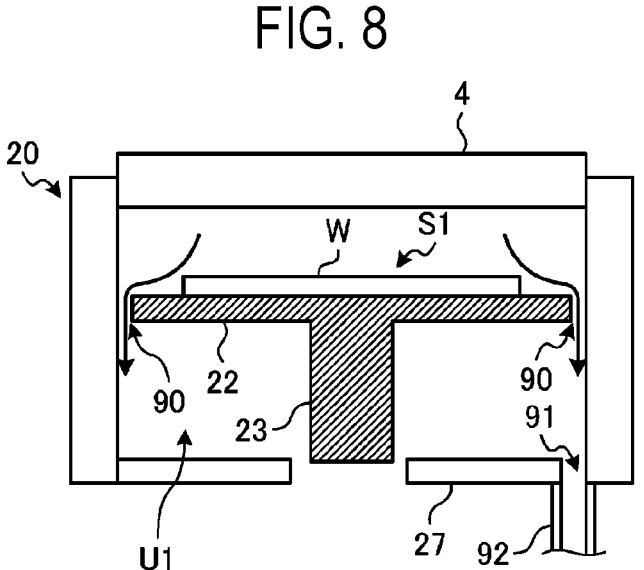
FIG. 8 is a view illustrating another example of the gas flow during substrate processing according to an embodiment.

FIG. 8 is a view illustrating another example of the gas flow during substrate processing according to an embodiment. FIG. 8 illustrates another example of the gas flow in the four processing spaces S1 to S4 in the processing container 20 when a film forming process is executed as substrate processing. Hereinbelow, the processing space S1 will be described as an example.

Inside the processing container 20, the stage 22 on which the wafer W is placed is disposed, and the gas supply 4 is disposed to face the stage 22. The processing space S1 is formed between the stage 22 and the gas supply 4. By placing the stage 22 to the processing position by the driving mechanism 80, the interior of the processing container 20 is partitioned, by the stage 22, into the upper processing space S1, in which the film forming process is executed on the wafer W, and the lower processing space U1.

The processing container 20 is provided with a gap 90 between the stage 22 and an inner wall thereof. For example, the processing container 20 is provided with, for example, an inner wall to surround the stage 22 at the processing position with the gap 90 around the stage 22.

An exhaust port 91 is provided in the bottom 27 of the processing container 20. The exhaust port 91 is connected to an exhaust system such as a vacuum pump via an exhaust pipe 92. The processing container 20 illustrated in FIG. 8 is configured such that the processing space S1 can be exhausted via the gap 90 by exhausting the lower space U1 from the exhaust port 91 by the vacuum pump.

When executing the film forming process, the vacuum processing apparatus 2 configured as illustrated in FIG. 8 exhausts the processing space S1 via the gap 90 by exhausting the lower space U1 from the exhaust port 91 by the vacuum pump. In addition, the vacuum processing apparatus 2 supplies various gases used for the film formation from the gas supply 4 to the processing space S1.

Figure 9:
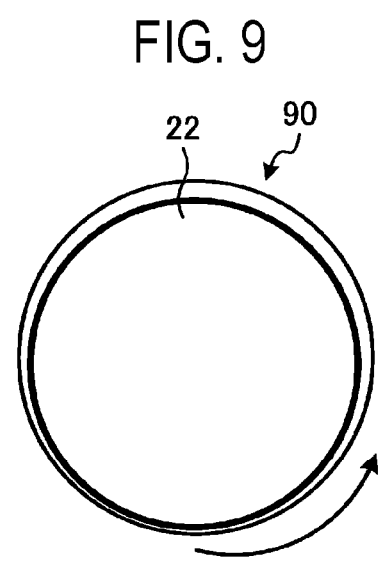

When the exhaust paths as illustrated in FIGS. 7 and 8 are provided, due to an influence of the gap 90 around the stage 22, exhaust characteristics may become non-uniform in the circumferential direction of the stage 22, resulting in a deviation in the gas flow, and processing results of the film forming process may become non-uniform in the circumferential direction of the stage 22. FIG. 9 is a view for explaining an example of a cause of non-uniform exhaust characteristics according to an embodiment. FIG. 9 illustrates a top view of the stage 22 viewed from above. The stage 22 has a circular top surface. The wafer W is mounted on the top surface of the stage 22. The gap 90 is provided around the stage 22. In the case of the configuration illustrated in FIG. 7, the gap 90 is formed between the inner side surface of the guide 34 and the stage 22, and the seal gas flows through the gap 90. In the case of the configuration illustrated in FIG. 8, the gap 90 is formed between the inner side surface of the processing container 20 and the stage 22, and an exhaust gas flows through the gap 90. Here, as illustrated in FIG. 9, when the position of the stage 22 slightly deviates, a clearance of the gap 90 is not uniform in the circumferential direction. When the clearance of the gap 90 is not uniform in the circumferential direction, a deviation occurs in the gas flow in the circumferential direction on the top surface of the stage 22, making it difficult to achieve uniform film formation. For example, in the case of the configuration illustrated in FIG. 7, the flow of seal gas increases in a portion in which the clearance is large, and the flow of seal gas decreases in a portion in which the clearance is small. As a result, a deviation occurs in the gas flow on the top surface of the stage 22, making it difficult to make film formation uniform in the circumferential direction. In addition, in the case of the configuration illustrated in FIG. 8, the flow of the exhaust gas increases in to portion in which the clearance is large, and the flow of the exhaust gas decreases in a portion in which the clearance is small. As a result, a deviation occurs in the gas flow on the top surface of the stage 22, making it difficult to make film formation uniform in the circumferential direction.

Therefore, in the present embodiment, the controller 8 executes the film forming process on the wafer W while changing the position of the stage 22 by the driving mechanism 80 such that a width of the gap 90 is uniform in a time average during the film forming process. Any method for changing the position of the stage 22 may be used as long as the non-uniformity of the width of the gap 90 can be reduced in a time average.

Figure 10:
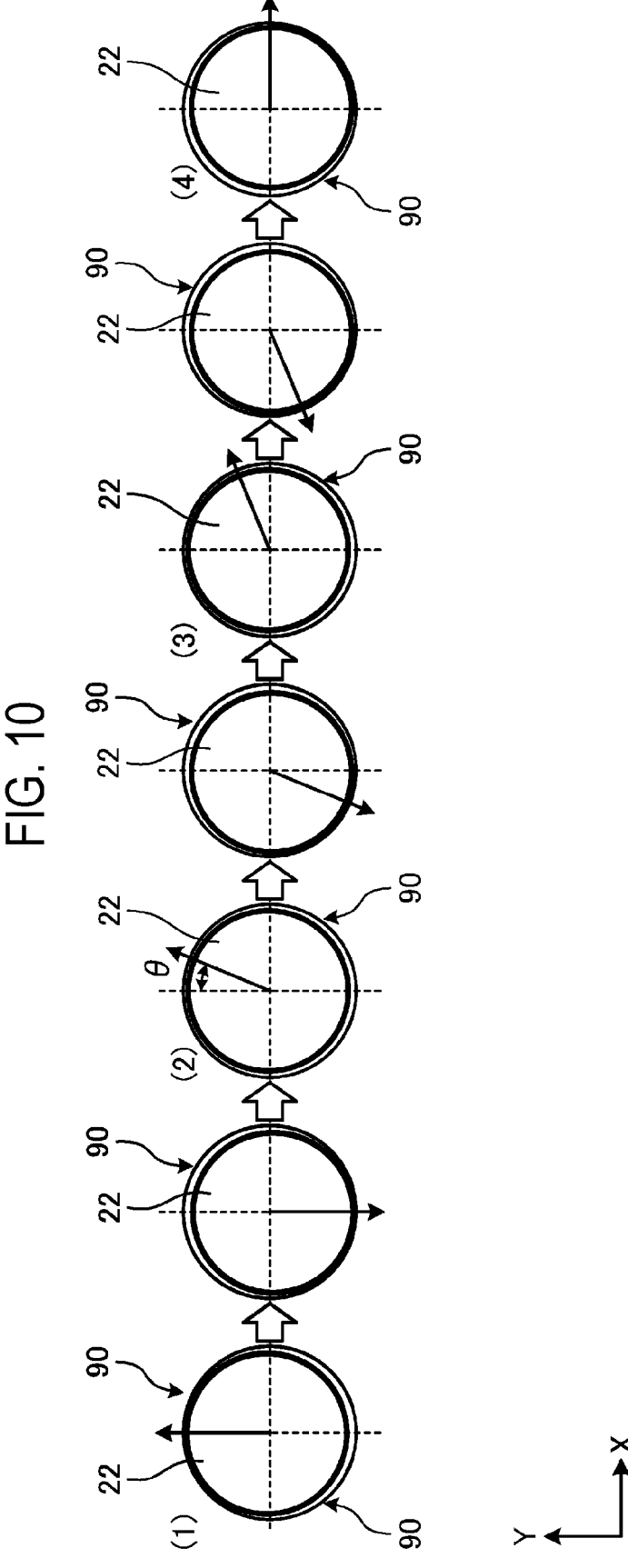
FIG. 10 is a view for explaining an example of a change in a position of a stage according to an embodiment.
Figure 11:
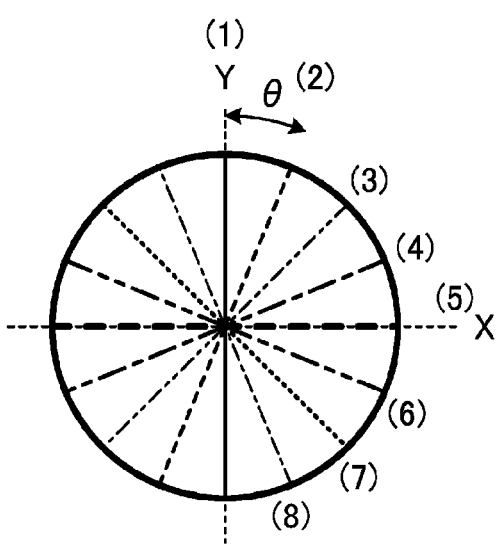
FIG. 11 is a view for explaining an example of a change in a reciprocating direction of the stage according to an embodiment.

For example, the controller 8 executes the film forming process on the wafer W while causing, by the driving mechanism 80, the stage 22 to reciprocate in the horizontal direction and to move such that the reciprocating direction rotates in the horizontal plane. FIG. 10 is a view for explaining an example of a change in the position of the stage 22 according to an embodiment. FIG. 10 illustrates a temporal change in the position of the stage 22. In FIG. 10, the up-down direction is defined as the Y-direction, and the left-right direction is defined as the X-direction. The arrows extending from the center of the stage 22 indicates a moving direction of the stage 22. For example, the controller 8 causes, by the driving mechanism 80, the stage 22 to move upward (in the positive Y-direction) and then to move downward (in the negative Y direction). As a result, as illustrated in (1) of FIG. 10, the stage 22 reciprocates in the Y direction. The controller 8 causes the stage 22 to reciprocate in the horizontal direction while causing the reciprocating direction of the stage 22 to rotate by an angle θ. For example, the controller 8 causes the reciprocating direction to rotate by an angle θ each time the stage 22 reciprocates an integer number of times. The timing for rotation by the angle θ may be, for example, a timing at which the stage 22 reciprocates an integer number of times plus 0.5 times, such as 1.5 times or 2.5 times. FIG. 11 is a view for explaining an example of a change in the position of the stage 22 according to the embodiment. For example, the controller 8 sequentially changes the reciprocating direction of the stage 22 from (1) to (8). This makes the width of the gap 90 uniform in a time average, and thus it is possible to suppress non-uniformity in film thickness in the circumferential direction of the stage 22.

Figure 12:
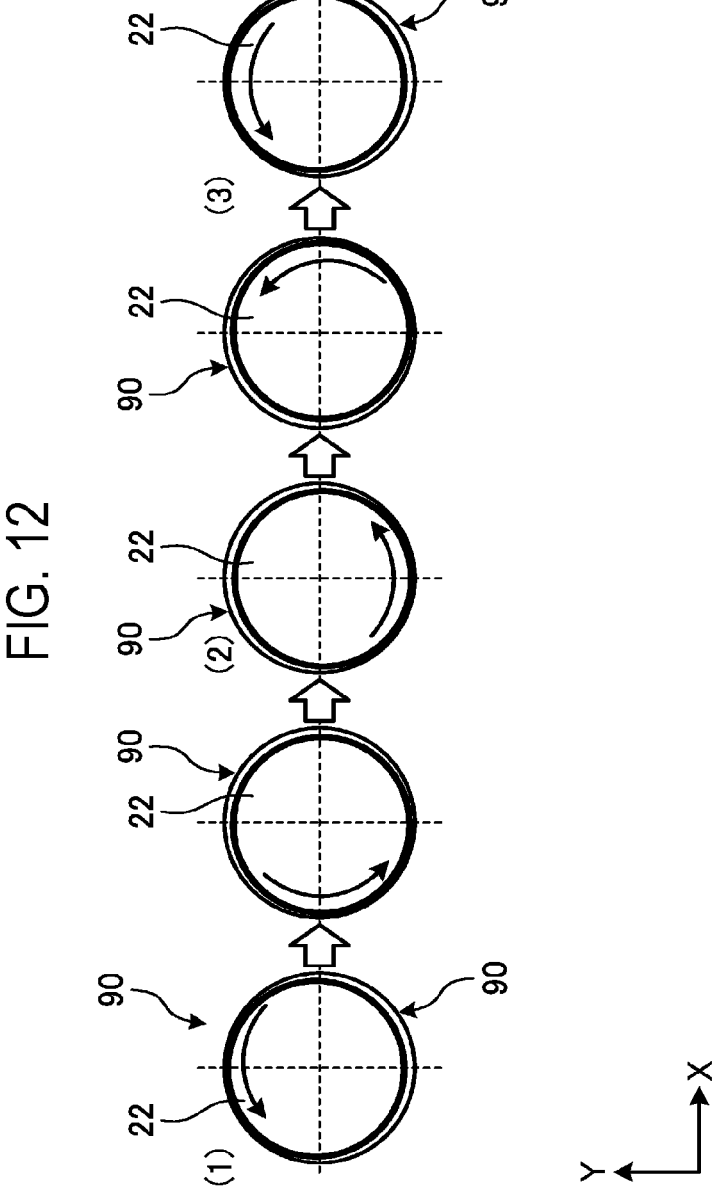
FIG. 12 is a view for explaining another example of the change in the position of the stage according to an embodiment.
Figure 13:
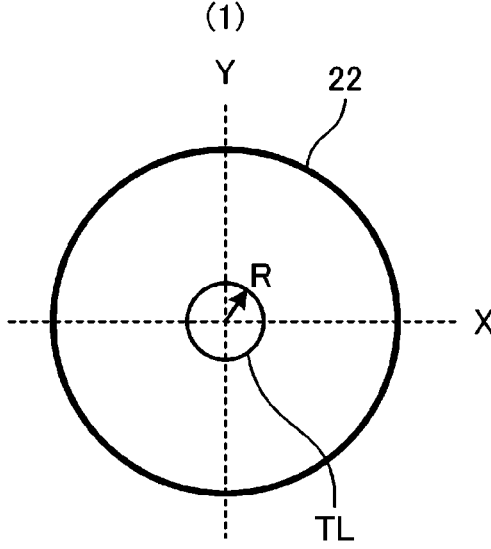
FIG. 13 is a view for explaining another example of the change in the position of the stage according to an embodiment.

In addition, for example, the controller 8 executes the film forming process on the wafer W while causing, by the driving mechanism 80, the stage 22 to move in a horizontal plane such that the center point of the stage 22 draws a circle in the horizontal plane. FIG. 12 is a view for explaining another example of a change in the position of the stage 22 according to the embodiment. FIG. 12 illustrates a temporal change in the position of the stage 22. In FIG. 12, the up-down direction is defined as the Y-direction, and the left-right direction is defined as the X-direction. For example, the controller 8 causes, by the driving mechanism 80, the stage 22 to move in the horizontal plane such that the center point of the stage 22 draws a circle in the horizontal plane around a predetermined center position. The center position may be, for example, a reference position such as a center position of a corresponding one of the processing space S1 to S4 in the horizontal plane or the center of the shower plate 43 (e.g., the center of the region in which the gas ejection holes 45 are formed), or may be a predetermined position within the processing container 20. FIG. 13 is a view for explaining another example of a change in the position of the stage 22 according to the embodiment. FIG. 13 illustrates a trajectory TL along which the center point of the stage 22 has moved. The trajectory TL draws a circle with a radius R. The radius R is, for example, about 1 mm to 2 mm at maximum. This makes the width of the gap 90 uniform in a time average, and thus it is possible to suppress non-uniformity in film thickness in the circumferential direction of the stage 22.

A moving speed of the stage 22 by the driving mechanism 80 may be, in some embodiments, 1 mm/sec or less. This makes it possible to prevent the wafer W from slipping on the stage 22. In addition, since the gas flow on the top surface of the wafer W can follow the movement of the stage 22, it is possible to stably execute the film forming process on the wafer W.

The controller 8 controls the driving mechanism 80 during the film forming process to repeatedly execute the moving operation of the stage 22 by the driving mechanism 80 a plurality of times. For example, the controller 8 sets a film forming time to 10 minutes, and executes a series of moving operations of the stage 22 ten times during the film forming time. In this case, an operation time for one cycle is one minute, which is a very slow speed.

In addition, in the above-described embodiments, the case where a deviation occurs in the gas flow on the top surface of the stage 22 due to the non-uniformity of the clearance of the gap 90 in the circumferential direction. However, the present disclosure is not limited thereto. For example, even if the clearance of the gap 90 is uniform in the circumferential direction, when there is a deviation in the exhaust characteristics around the stage 22, a deviation may occur in the gas flow on the top surface of the stage 22. For example, the vacuum processing apparatus 2 exhausts the processing space S1 from the periphery of the stage 22 by means of the guide 34. The flow path 35 of the guide 34 communicates with the exhaust port 33 at one point. In this case, the exhaust characteristics around the stage 22 may be strong on the side of the exhaust port 33 and weak on the opposite side to the exhaust port 33, so that a deviation may occur in the exhaust characteristics around the stage 22. In addition, a deviation may occur in the exhaust characteristics around the stage 22 due to the deformation of the processing container 20 or the like by the influence of heat, vacuum, or the like. Even in such a case, during the film forming process, it is possible to suppress the non-uniformity of the film thickness in the circumferential direction of the stage 22 by changing, by the driving mechanism 80, the position of the stage 22 to make the width of the gap 90 uniform in a time average.

[Specific Example of Flow of Substrate Processing Method]

Next, a specific example of a flow of a substrate processing method according to an embodiment will be described. FIG. 14 is a flowchart illustrating an example of a substrate processing method according to an embodiment. FIG. 14 illustrates an example of a flow of a film forming process as substrate processing.

The controller 8 causes the processing space S1 of the processing container 20 to be exhausted (step S10). For example, in the case of the configuration illustrated in FIG. 7, the controller 8 causes the vacuum pump 62 to perform exhaust in the state in which the seal gas is caused to flow from the lower space U1 to the processing space S1 via the gap 90, and causes the processing space S1 to be exhausted from the periphery of the stage 22 by means of the guide 34. For example, in the case of the configuration illustrated in FIG. 8, the controller 8 causes the processing space S1 to be exhausted via the gap 90 by causing the lower space U1 to be exhausted from the exhaust port 91 by the vacuum pump.

The controller 8 executes the film forming process on the wafer W while changing the position of the stage 22 by the driving mechanism 80 such that the width of the gap 90 becomes uniform in a time average (step S11). For example, as illustrated in FIGS. 10 and 11, the controller 8 executes the film forming process on the wafer W while causing, by the driving mechanism 80, the stage 22 to reciprocate in the horizontal direction and to move such that the reciprocating direction rotates in the horizontal plane. In addition, as illustrated in FIGS. 12 and 13, for example, the controller 8 executes the film forming process on the wafer W while causing, by the driving mechanism 80, the stage 22 to move in the horizontal plane such that the center point of the stage 22 draws a circle in the horizontal plane.

As a result, the vacuum processing apparatus 2 can suppress non-uniformity in the processing results of the film forming process in the circumferential direction of the stage 22.

Effects of Embodiment

As described above, the substrate processing method according to an embodiment is a substrate processing method performed by a substrate processing apparatus (e.g., the vacuum processing system 1 or the vacuum processing apparatus 2). The substrate processing apparatus includes the processing container 20, the stage 22, the exhaust mechanism (e.g., the vacuum pump 62), and the driving mechanism 80. The stage 22 is disposed inside the processing container 20 with the gap 90 between the inner wall of the processing container 20 and the side surface thereof or between a component that constitutes the processing container 20 (where the component is provided separately from the inner wall of the processing container 20 and substantially constitutes a wall surface that replaces the inner wall) and the side surface thereof, and the wafer W is placed on the stage. The stage 22 partitions the interior of the processing container 20 into an upper first space (e.g., the processing spaces S1 to S4), in which substrate processing is performed on the wafer W, and a lower second space (e.g., the lower spaces U1 to U4). The exhaust mechanism is configured to exhaust the first space via the gap 90 by exhausting the second space, or to exhaust the first space in a state in which the seal gas is caused to flow from the second space to the first space via the gap 90. The driving mechanism 80 is configured to move the stage 22. The substrate processing method includes an exhaust step (e.g., step S10) and a substrate processing step (e.g., step S11). In the exhaust step, the first space is exhausted by the exhaust mechanism. In the substrate processing step, substrate processing is executed on the wafer W while changing the position of the stage 22 by the driving mechanism 80 such that the width of the gap 90 becomes uniform in a time average. As a result, with the substrate processing method according to an embodiment, it is possible to suppress non-uniformity in the substrate processing results in the circumferential direction of the stage 22.

In the substrate processing method according to an embodiment, in the substrate processing step, the substrate processing is executed on the wafer W while causing, by the driving mechanism 80, the stage 22 to reciprocate in the horizontal direction and to move such that the reciprocating direction rotates in the horizontal plane. As a result, with the substrate processing method according to the embodiment, it is possible to reduce non-uniformity in the width of the gap 90 in a time average, and thus, it is possible to suppress non-uniformity in the substrate processing results in the circumferential direction of the stage 22.

In the substrate processing method according to an embodiment, in the substrate processing step, the substrate processing is executed on the wafer W while causing, by the driving mechanism 80, the stage 22 to move such that the reciprocating direction rotates by a predetermined angle in the horizontal plane each time the stage 22 reciprocates an integer number of times. As a result, with the substrate processing method according to the embodiment, it is possible to make the width of the gap 90 uniform in a time average, and thus, it is possible to suppress non-uniformity in the substrate processing results in the circumferential direction of the stage 22.

In addition, in the substrate processing method according to an embodiment, in the substrate processing step, the substrate processing is executed on the wafer W while causing, by the driving mechanism 80, the stage 22 to move in the horizontal plane such that the center point of the stage 22 draws a circle in the horizontal plane. As a result, with the substrate processing method according to the embodiment, it is possible to make the width of the gap 90 uniform in a time average, and thus it is possible to suppress the non-uniformity in the substrate processing results in the circumferential direction of the stage 22.

In addition, in the substrate processing method according to an embodiment, in the substrate processing step, during the substrate processing, the driving mechanism 80 repeats the moving operation of changing the position of the stage 22 a plurality of times. As a result, with the substrate processing method according to the embodiment, it is possible to reduce non-uniformity of the width of the gap 90 even in a part of the period, such as the first half period or the second half period of the processing period of the substrate processing. Therefore, even when the substrate processing is not uniform in the first half period and the second half period, it is possible to suppress non-uniformity of the substrate processing results in the circumferential direction of the stage 22.

In addition, in the substrate processing method according to an embodiment, in the substrate processing step, the driving mechanism 80 moves the stage 22 at the moving speed of 1 mm/sec or less during the substrate processing. As a result, with the substrate processing method according to the embodiment, it is possible to prevent the substrate from slipping on the stage 22. In addition, in the substrate processing method according to an embodiment, the gas flow on the top surface of the substrate can follow the movement of the stage 22, and thus it is possible to stably process the substrate.

Although embodiments have been described above, it should be considered that the embodiments disclosed herein are exemplary in all respects and are not restrictive. In addition, the embodiments described above may be omitted, replaced, or modified in various forms without departing from the scope and spirit of the claims.

For example, in the embodiments described above, an example in which the vacuum processing apparatus 2 performs a film forming process as substrate processing has been described. However, the present disclosure is not limited thereto. The substrate processing may be, for example, an etching process such as plasma etching, or any substrate processing. The technique disclosed herein may be applied to any apparatus that performs other substrate processing such as plasma etching.

In the embodiments described above, the case in which the substrate is the wafer W has been described as an example, but the present disclosure is not limited thereto. The substrate may be any substrate such as a glass substrate. In addition, the stage does not mean only the stage 22, but may have a configuration including a cover member, which is provided separately from the stage 22 and covers the outer peripheral portion of the stage 22.

According to the present disclosure, it is possible to suppress non-uniformity of substrate processing results in a circumferential direction of a stage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method performed in a substrate processing apparatus, wherein the substrate processing apparatus comprises:

a processing container;

a stage disposed inside the processing container with a gap between an inner side wall of the processing container and a side surface of the stage or between a component constituting the processing container and the side surface of the stage, and configured to place a substrate on the stage, wherein the stage partitions an interior of the processing container into an upper first space, in which substrate processing is performed on the substrate, and a lower second space;

an exhaust mechanism configured to exhaust the first space via the gap by exhausting the second space, or configured to exhaust the first space in a state in which a seal gas is caused to flow from the second space to the first space via the gap; and a driving mechanism configured to move the stage, wherein the substrate processing method comprises:

exhausting the first space by the exhaust mechanism; and executing the substrate processing on the substrate while causing, by the driving mechanism, a position of the stage to be changed such that a width of the gap becomes uniform in a time average, and wherein the act of the executing the substrate processing includes executing the substrate processing on the substrate while causing, by the driving mechanism, the stage to move such that a center point of the stage reciprocates in a reciprocating direction that rotates in a horizontal plane.

2. The substrate processing method of claim 1, wherein the act of the executing the substrate processing includes executing the substrate processing on the substrate while causing, by the driving mechanism, the stage to move such that the reciprocating direction rotates by a predetermined angle in the horizontal plane each time the stage reciprocates an integer number of times.

3. The substrate processing method of claim 2, wherein the act of executing the substrate processing includes, during the substrate processing, repeatedly executing a moving operation of changing the position of the stage by the driving mechanism a plurality of times.

4. The substrate processing method of claim 3, wherein the act of executing the substrate processing includes, during the substrate processing, moving the stage at a moving speed of 1 mm/sec or less by the driving mechanism.

5. The substrate processing method of claim 4, wherein the driving mechanism is configured to rotate the stage by rotating a support, which supports the stage, with the support as a rotation axis, and wherein the act of executing the substrate processing includes executing the substrate processing on the substrate by rotating the stage while changing the position of the stage.

6. The substrate processing method of claim 5, wherein the driving mechanism includes a plurality of actuators configured to function as a parallel link mechanism to cause the stage to move in three orthogonal axial directions and in rotational directions around the three axial directions.

7. The substrate processing method of claim 1, wherein the act of executing the substrate processing includes, during the substrate processing, repeatedly executing a moving operation of changing the position of the stage by the driving mechanism a plurality of times.

8. The substrate processing method of claim 1, wherein the act of executing the substrate processing includes, during the substrate processing, moving the stage at a moving speed of 1 mm/sec or less by the driving mechanism.

9. The substrate processing method of claim 1, wherein the driving mechanism is configured to rotate the stage by rotating a support, which supports the stage, with the support as a rotation axis, and wherein the act of executing the substrate processing includes executing the substrate processing on the substrate by rotating the stage while changing the position of the stage.

10. The substrate processing method of claim 1, wherein the act of executing the substrate processing includes executing the substrate processing on the substrate while changing the position of the stage in a state in which a support, which supports the stage, is stopped without being rotated with the support as a rotation axis.

11. A substrate processing method performed in a substrate processing apparatus, wherein the substrate processing apparatus comprises:

a processing container;

a stage disposed inside the processing container with a gap between an inner side wall of the processing container and a side surface of the stage or between a component constituting the processing container and the side surface of the stage, and configured to place a substrate on the stage, wherein the stage partitions an interior of the processing container into an upper first space, in which substrate processing is performed on the substrate, and a lower second space;

an exhaust mechanism configured to exhaust the first space via the gap by exhausting the second space, or configured to exhaust the first space in a state in which a seal gas is caused to flow from the second space to the first space via the gap; and a driving mechanism configured to move the stage, wherein the substrate processing method comprises:

exhausting the first space by the exhaust mechanism; and executing the substrate processing on the substrate while causing, by the driving mechanism, a position of the stage to be changed such that a width of the gap becomes uniform in a time average, and wherein the act of the executing the substrate processing includes executing the substrate processing on the substrate while causing, by the driving mechanism, the stage to move in a horizontal plane such that a trajectory along which a center point of the stage moves draws a circle in the horizontal plane.

12. A substrate processing apparatus comprising:

a processing container;

a stage disposed inside the processing container with a gap between an inner side wall of the processing container and a side surface of the stage or between a component constituting the processing container and the side surface of the stage, and configured to place a substrate on the stage, wherein the stage partitions an interior of the processing container into an upper first space, in which substrate processing is performed on the substrate, and a lower second space;

an exhaust mechanism configured to exhaust the first space via the gap by exhausting the second space, or configured to exhaust the first space in a state in which a seal gas is caused to flow from the second space to the first space via the gap;

a driving mechanism configured to move the stage; and a controller configured to execute the substrate processing on the substrate while causing, by the driving mechanism, a position of the stage to be changed such that a width of the gap becomes uniform in a time average, wherein the causing the position of the stage to be changed includes causing, by the driving mechanism, the stage to move such that a center point of the stage reciprocates in a reciprocating direction that rotates in a horizontal plane.

13. A substrate processing apparatus comprising:

a processing container;

a stage disposed inside the processing container with a gap between an inner side wall of the processing container and a side surface of the stage or between a component constituting the processing container and the side surface of the stage, and configured to place a substrate on the stage, wherein the stage partitions an interior of the processing container into an upper first space, in which substrate processing is performed on the substrate, and a lower second space;

an exhaust mechanism configured to exhaust the first space via the gap by exhausting the second space, or configured to exhaust the first space in a state in which a seal gas is caused to flow from the second space to the first space via the gap;

a driving mechanism configured to move the stage; and a controller configured to execute the substrate processing on the substrate while causing, by the driving mechanism, a position of the stage to be changed such that a width of the gap becomes uniform in a time average, wherein the causing the position of the stage to be changed includes causing, by the driving mechanism, the stage to move in a horizontal plane such that a trajectory along which a center point of the stage moves draws a circle in the horizontal plane.

* * * * *